(12) United States Patent
Kojima et al.

(10) Patent No.: US 7,438,969 B2
(45) Date of Patent: Oct. 21, 2008

(54) FILLING MATERIAL, MULTILAYER WIRING BOARD, AND PROCESS OF PRODUCING MULTILAYER WIRING BOARD

(75) Inventors: Toshifumi Kojima, Komaki (JP);
Makoto Wakazono, Hashima (JP);
Toshikatu Takada, Kohnan (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 0 days.

(21) Appl. No.: 10/615,067

(22) Filed: Jul. 9, 2003

(65) Prior Publication Data
US 2004/0009335 A1 Jan. 15, 2004

(30) Foreign Application Priority Data

| Jul. 10, 2002 | (JP) | P.2002-201223 |
| Dec. 27, 2002 | (JP) | P.2002-380796 |
| Apr. 30, 2003 | (JP) | P.2003-125477 |

(51) Int. Cl.
*B32B 3/00* (2006.01)
*H05K 1/03* (2006.01)

(52) U.S. Cl. ............. 428/209; 428/901; 174/255; 174/262; 174/264

(58) Field of Classification Search ......... 428/209, 428/901; 29/850, 852; 174/262, 264
See application file for complete search history.

(56) References Cited

U.S. PATENT DOCUMENTS

| 4,383,363 | A | * | 5/1983 | Hayakawa et al. | 29/847 |
|---|---|---|---|---|---|
| 4,410,457 | A | * | 10/1983 | Fujimura et al. | 252/508 |
| 5,043,102 | A | * | 8/1991 | Chen et al. | 252/514 |
| 5,243,142 | A | * | 9/1993 | Ishikawa et al. | 174/262 |
| 5,436,062 | A | * | 7/1995 | Schmidt et al. | 428/209 |
| 5,484,647 | A | * | 1/1996 | Nakatani et al. | 428/209 |
| 5,652,042 | A | * | 7/1997 | Kawakita et al. | 428/209 |
| 5,733,467 | A | * | 3/1998 | Kawakita et al. | 216/18 |
| 5,914,358 | A | * | 6/1999 | Kawakita et al. | 523/458 |
| 5,972,482 | A | * | 10/1999 | Hatakeyama et al. | 428/209 |
| 5,977,490 | A | * | 11/1999 | Kawakita et al. | 174/265 |
| 6,010,768 | A | | 1/2000 | Yasue et al. | |
| 6,060,150 | A | * | 5/2000 | Nakatani et al. | 428/209 |
| 6,096,411 | A | * | 8/2000 | Nakatani et al. | 428/209 |
| 6,108,903 | A | * | 8/2000 | Nakatani et al. | 29/852 |
| 6,139,777 | A | * | 10/2000 | Omoya et al. | 252/500 |
| 6,197,407 | B1 | * | 3/2001 | Andou et al. | 428/209 |
| 6,217,988 | B1 | | 4/2001 | Yasue et al. | |
| 6,224,965 | B1 | * | 5/2001 | Haas et al. | 428/209 |
| 6,242,078 | B1 | * | 6/2001 | Pommer et al. | 428/209 |

(Continued)

FOREIGN PATENT DOCUMENTS

JP  61-84409  7/1994

(Continued)

*Primary Examiner*—Cathy Lam
(74) *Attorney, Agent, or Firm*—Morgan, Lewis & Bockius LLP

(57) ABSTRACT

A solvent-free filling material comprising a filler, a thermosetting resin, a curing agent, and a curing catalyst, wherein the thermosetting resin is an epoxy resin, and the curing agent is a dicyandiamide curing agent; a multilayer printed wiring board comprising a substrate, a through-hole, the filling material filling the through-hole, and a conductor layer formed on an exposed surface of the filling material in the through-hole; and a process for producing the multilayer printed wiring board.

8 Claims, 1 Drawing Sheet

U.S. PATENT DOCUMENTS

| | | |
|---|---|---|
| 6,251,502 B1 | 6/2001 | Yasue et al. |
| 6,323,439 B1 * | 11/2001 | Kambe et al. ................ 174/262 |
| 6,504,111 B2 * | 1/2003 | Curcio et al. ................ 174/264 |
| 6,558,780 B2 * | 5/2003 | Suzuki et al. ................ 428/209 |
| 6,780,493 B2 * | 8/2004 | Noda et al. .................. 428/209 |
| 6,790,305 B2 * | 9/2004 | Curcio et al. ................ 156/247 |
| 6,810,583 B2 * | 11/2004 | Carpenter et al. ............. 29/852 |
| 6,812,065 B1 * | 11/2004 | Kitamura ..................... 438/119 |
| 6,835,895 B1 * | 12/2004 | Asai et al. .................... 174/255 |
| 6,847,527 B2 * | 1/2005 | Sylvester et al. ............. 361/763 |
| 6,916,873 B2 | 7/2005 | Yamamoto et al. |

FOREIGN PATENT DOCUMENTS

| | | |
|---|---|---|
| JP | 6-275959 | 9/1994 |
| JP | 10-075027 | 3/1998 |
| JP | 10-182794 | 7/1998 |
| JP | 2000-017090 | 1/2000 |
| JP | 2001-177254 | 6/2001 |
| JP | 2002-171072 | 6/2002 |
| WO | WO02-44274 | 6/2002 |

* cited by examiner

FILLING MATERIAL, MULTILAYER WIRING BOARD, AND PROCESS OF PRODUCING MULTILAYER WIRING BOARD

FIELD OF THE INVENTION

This invention relates to a filling material which can be used to fill through-holes of a multilayer printed wiring board (hereinafter abbreviated as ML-PWB) having insulating layers and conductor layers built-up alternately; an ML-PWB fabricated by using the filling material; and a process of producing an ML-PWB using the filling material.

BACKGROUND OF THE INVENTION

In recent years, development of ML-PWBs having insulating layers and conductor layers alternately laminated on a substrate has proceeded, coping with the trend in electronic equipment towards greater compactness, lighter weight and increased mounting density.

In an ordinary ML-PWB conductor layers formed on both sides of a printed wiring board (PWB) substrate are electrically interconnected by making a through-hole piercing the substrate and plating the inner wall of the through-hole or filling the through-hole with a conductive paste. In the former case, the plated through-hole is plugged with a filling material, and a conductor layer and an insulating layer are stacked thereon to cover the exposed surface of the filling material to fabricate an ML-PWB.

Among filling materials known for this application are those comprising a bisphenol epoxy resin as a thermosetting resin, an imidazole curing agent, and inorganic particles as an additive as disclosed in JP-A-10-75027 (reference 1).

ML-PWBs having through-holes and via conductors for electrical connection of conductor layers are known. ML-PWBs of this type are produced by the steps of connecting conductor layers formed on both sides of a PWB substrate via a conductor formed on the inner wall of the through-holes (via conductor), filling the through-holes with a filling material comprising an organic polymer, forming a conductor layer by printing on the upper side of the filling material to make a connection with the exposed part of the via conductor, laminating an insulating layer on the conductor layer, laminating a conductor pattern layer and a solder resist layer thereon by printing, and providing the insulating layer with a via conductor to connect the conductor layer on the filling material and the conductor pattern layer on the insulating layer as disclosed in JP-A-6-275959 (reference 2).

SUMMARY OF THE INVENTION

According to the technique of reference 1, the adhesion between the filling material and the conductor layer laminated on the upper side of the filling material greatly reduces in accelerated testing for reliability, such as a heat resistance test and a moisture resistance test (e.g., pressure cooker test). It follows that delamination easily occurs between the filling material and the conductor layer provided thereon, which can lead to cracks or delaminations at the interfaces of the insulating layer, the conductor pattern layer, the solder resist layer, etc. built up thereon.

According to the technique of reference 2, insufficient adhesive strength between the filling material and the conductor layer provided thereon would cause such problems as delaminations at the interfaces of the conductor layer, insulating layer, conductor pattern layer, solder resist layer, etc. provided on the filling material and cracks in a thermal shock test, a pressure cooker test, and the like.

An object of the present invention is to provide a filling material which, when applied into a through-hole, secures improved adhesion to a conductor layer provided thereon and prevents delamination or cracking of the conductor layer, the insulating layer, the solder resist layer, etc. laminated on the upper side of the filling material in reliability tests such as a thermal shock test and a pressure cooker test.

Another object of the present invention is to provide an ML-PWB and a process of producing an ML-PWB using the filling material.

To accomplish the above objects, the present invention provides, in its first aspect, a solvent-free filling material comprising a filler, a thermosetting resin, a curing agent, and a curing catalyst, wherein the thermosetting resin is an epoxy resin, and the curing agent is a dicyandiamide curing agent.

The filling material according to the present invention, applied into through-holes of a PWB substrate and cured, hardly reduces the adhesion to a conductor layer formed thereon and therefore prevents delaminations at various interfaces of the conductor layer and other layers provided thereon, such as an insulating layer, a conductor pattern layer, and a solder resist layer, and cracks.

DETAILED DESCRIPTION OF THE INVENTION

Figure 1:
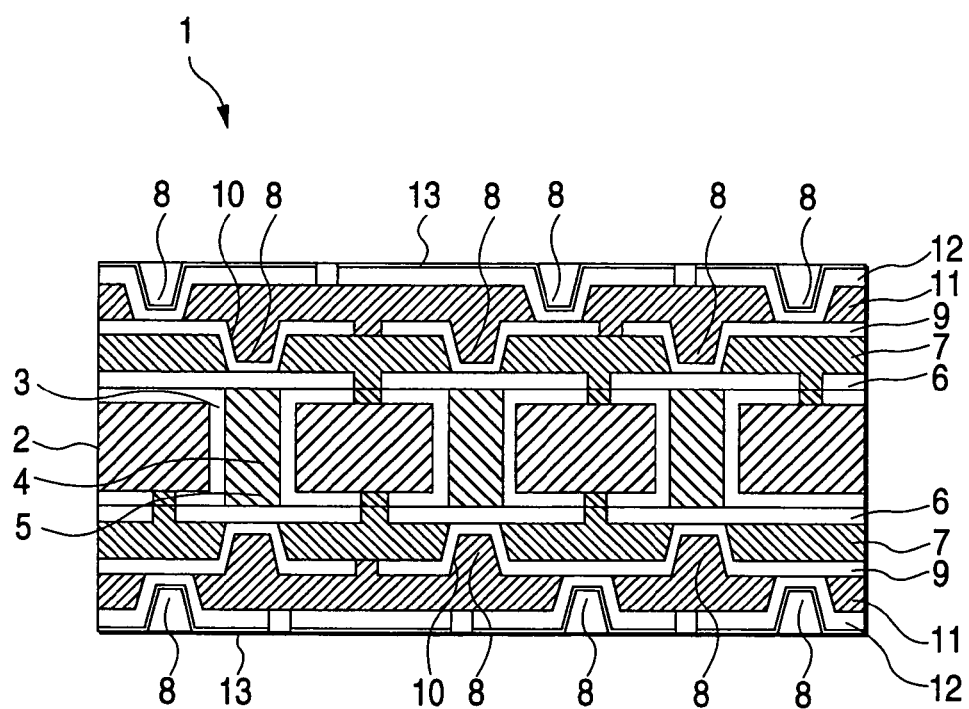
FIG. 1 is a cross-section illustrating the layer structure of the ML-PWB produced in Examples.

The filling material according to the present invention comprises an epoxy resin as a thermosetting resin. Alicyclic epoxy resins of bisphenol type, phenol novolak type, cresol novolak type, glycidylamine type, etc. are preferred in view of their superiority in heat resistance, chemical resistance, and flowability. Those mainly comprising a glycidylamine epoxy resin or a bisphenol epoxy resin are still preferred. Those of aminophenol type, bisphenol A type or bisphenol F type are particularly preferred because of their low viscosity as well as their heat resistance, chemical resistance, and flowability. A filling material with a low viscosity exhibits excellent capability of filling through-holes.

Containing a filler, the filling material of the invention exhibits controlled thermal expansion on curing. That is, the filling material has controlled shrinkage on curing and controlled thermal expansion in heat application after curing. The filler which can be used in the filling material of the invention includes ceramics, dielectrics, and metals. Suitable ceramic fillers include silica, alumina, talc, calcium carbonate, and aluminum nitride. Suitable dielectric fillers include barium titanate, lead titanate, and lead titanate zirconate. Suitable metal fillers include copper, silver, copper-silver alloys, and whiskers. The filler particles may be subjected to surface treatment with a silane coupling agent, etc. to have increased adhesion to the thermosetting resin. The metal fillers may be subjected to anticorrosion treatment. The filling material may contain ultrafine particles of an inorganic substance, e.g., silica, titania or alumina, a polymeric dispersant, and the like in order to prevent the filler or a curing agent in powder form from settling.

Containing a dicyandiamide curing agent, the filling material of the invention has a long pot life (stability before curing) and, upon curing, provides a cured product with excellent resistance against heat and chemicals (inclusive of oxidizing agents and bases). In general a filling material comprising a thermosetting resin and a curing agent has a short pot life because curing reaction proceeds while storage. In contrast, a mixture of a dicyandiamide curing agent and an epoxy resin undergoes little change with time and enjoys a long pot life. Hence, the filling material of the invention assures good workability in through-hole filling.

Free from solvent, the filling material of the invention in through-holes of an ML-PWB hardly causes adhesion failure, such as blisters, bubbles and cracks, even when thermal load is imposed during PWB fabrication or in a reliability test such as a thermal impact test.

Since use of a dicyandiamide curing agent results in reduced deterioration in adhesive strength between the filling material and the conductor layer formed thereon in a heat and/or moisture resistance test, e.g., a pressure cooker test, blistering and delamination can be prevented from occurring between a cured product of the filling material and the conductor layer in such reliability testing. This effect of using the dicyandiamide curing agent is particularly pronounced where the filling material has a filler content of 35% by volume or more, especially 40% by volume or more.

If desired, the filling material of the invention can contain other additives such as defoaming agents, leveling agents, and thickeners.

In an illustrative and advisable embodiment, the filling material of the invention comprises 89 to 97 parts by weight of the thermosetting resin per 100 parts by weight of the total of the thermosetting resin and the curing agent (hereinafter, PHR), 3 to 11 PHR of the curing agent, 0.5 to 9 PHR of the curing catalyst, and 100 to 1000 PHR of the filler.

The filling material of the invention preferably contains a urea compound as a curing catalyst. A urea compound as a curing catalyst allows the filling material to cure with a uniform composition while preventing the filler, the thermosetting resin, the curing agent, etc. from being localized in through-holes. A urea compound curing catalyst provides a cured product having high heat resistance. Besides, this catalyst makes it possible to secure the high heat resistance at relatively low curing temperatures of 120 to 180° C.

Usable urea compounds include dimethylurea, aromatic urea compounds, alicyclic urea compounds, and halogenated urea compounds. Preference given to halogen-free products, it is advisable not to use halogenated urea compounds.

It is preferred that the dicyandiamide curing agent be in the form of powders, dendrites, flakes or composite forms thereof.

According to the formulation of the present invention, the filler, the thermosetting resin, and the curing agent can be mixed up uniformly so that development of undercured parts can be avoided.

The dicyandiamide curing agent in powder form preferably has an average particle size of 0.1 to 100 μm, particularly 1 to 30 μm, especially 1 to 15 μm. Particles greater than this range tend to cause non-uniformity in kneading with the filler, the thermosetting resin, etc. and to clog through-holes, which can result in insufficient plugging. Particles smaller than 0.1 μm in average size make it difficult to assure a long pot life of the filling material and to control the viscosity of the filling material.

It is preferred for the filler of the filling material to be nearly (substantially) spherical particles with an average particle size of 0.1 to 12 μm and a maximum particle size of 75 μm or smaller. With the above-recited shape and size of the filler, the filling material can completely plug through-holes as small as 200 μm or less in inner diameter without clogging.

Where the filler has an average particle size exceeding 12 μm or a maximum particle size exceeding 75 μm, the filling material tends to clog the through-holes, resulting in insufficient plugging. Where the filler has an average particle size smaller than 0.1 μm, the filling material will have an increased viscosity and poor workability in plugging through-holes by printing, which can result in an extended printing time or insufficient plugging. It is particularly preferred for the filler to be nearly spherical with a maximum particle diameter of 75 μm or smaller so as to avoid insufficient plugging even as small through-holes as 200 μm or less in inner diameter.

It is especially preferred for the filler to be nearly spherical with a maximum particle diameter of 5 to 75 μm. Where the maximum diameter of the filler is smaller than 5 μm, it is difficult to control the particle size distribution, the filling capability, and the flowability of the filling material. Moreover, use of such fine particles leads to increase in cost.

The present invention also provides in its second aspect an ML-PWB comprising a substrate having a through-hole, a filling material filling the through-hole, and a conductor layer formed on the exposed surface of the filling material in the through-hole, wherein the filling material is the above-described filling material. The through-hole being plugged with the solvent-free filling material which has cured with a uniform composition, the ML-PWB manifests excellent adhesion between the filling material in the through-hole and the conductor layer provided thereon and is prevented from developing cracks, delaminations between the filling material and the conductor layer, and the like.

The substrate which can be used in the ML-PWB includes epoxy resin substrates, bismaleimide-triazine resin substrates, fluororesin substrates, and other heat-resistant resin substrates; composites composed of two or more of these resin sheets or a combination of these resin sheets and an inorganic or metallic component, such as a glass filler, glass nonwoven or a copper sheet; and copper-clad laminates of these substrates.

The ML-PWB preferably has an insulating layer formed on the upper surface of the conductor layer, a conductor pattern layer formed on the upper surface of the insulating layer, and a via conductor which electrically connects the conductor layer and the conductor pattern layer.

The filling material used in the ML-PWB of the invention has cured with a uniform composition without localizing the filler, the thermosetting resin, the curing agent, etc. and exhibits high adhesion to the conductor layer formed thereon. Therefore, the ML-PWB even with many conductor layers connected through via conductors at a high circuitry density is prevented from developing cracks and delaminations between layers (e.g., conductor layers, insulating layers, and solder resist layers) in reliability tests such as a thermal shock test and a pressure cooker test.

The through-hole preferably has a diameter of 200 μm or smaller, particularly 50 to 200 μm. The conductor layer preferably has a thickness of 20 μm or smaller (greater than 0 μm).

The effects of the present invention, namely, the improved adhesion between the filling material and the conductor layer covering the exposed surface of the filling material and the resultant advantages are particularly outstanding where the through-holes and the conductor layers have the above-recited preferred dimensions. In other words, in plugging through-holes of 200 μm or smaller in diameter, a filling material is liable to have its component, e.g., the thermosetting resin, the curing agent or the filler, localized near the opening of through-holes unless it cures with these components uniformly distributed. If localization happens, the filling material in the through-holes will have reduced adhesion to the conductor layer and easily cause delamination. On the other hand, through-holes of 50 μm or smaller in diameter are difficult to plug with the filling material.

The present invention also provides in its third aspect a process of producing an ML-PWB comprising the steps of filling a through-hole of a PWB substrate with the above-described filling material, curing the filling material, and forming a conductor layer on the upper surface of the filling material exposed on the surface of the substrate.

According to the process of the invention, the filling material in the through-hole is capable of curing with a uniform composition without causing the filler, the thermosetting resin, the curing agent, and the like to be localized and providing a cured product having high adhesion to the conductor layer, and the resulting ML-PWB is prevented from developing cracks or delaminations at the filling material/conductor layer interface in a reliability test such as a thermal shock test and a pressure cooker test.

The production of the ML-PWB can be carried as follows. A through-hole is made through a substrate with a drill or by laser machining. The inner wall of the through-hole is electroless plated and then electoplated to form a conductor of a desired deposit thickness.

The filling material is applied into the plated through-hole by known techniques such as screen printing or pressure printing and then cured by heating to a predetermined temperature. The substrate and the exposed surface of the filling material are ground (or polished) with a known tool such as a belt sander or a buffing tool for planarization. For easy grinding, the filling material may be half cured at a relatively lower temperature and, after grinding, completely cured by re-heating.

The exposed surface of the filling material is then metalized by surface roughening and electroless plating followed by electroplating in a known manner to form a conductor layer which covers the filling material. An etching resist is applied to the conductor layer, exposed to light, and developed. Etching the conductor layer followed by resist stripping gives a prescribed wire pattern. In order to improve the adhesion between the filling material and the conductor layer, the substrate surface and the exposed filling material surface may be subjected to wet etching with a permanganate or dry etching by plasma treatment.

In a preferred embodiment, the process further comprises the steps of laminating the conductor layer with an insulating layer, making a via hole through the insulating layer, and forming a conductor pattern layer and a via conductor on the upper surface of the insulating layer and on the inner wall of the via hole, respectively, to connect the conductor pattern layer and the conductor layer via the via conductor.

According to this preferred embodiment, since the filling material in the through-hole is capable of curing with a uniform composition without causing the filler, the thermosetting resin, the curing agent, etc. from being localized and providing a plug having high adhesion to the conductor layer, the resulting ML-PWB is prevented from developing cracks or delaminations between the conductor layer and the via conductor.

The process according to this embodiment can be carried out by adding the following steps to the above-described steps of drilling a through-hole, filling the through-hole with the filling material, and forming a conductor layer. An insulating layer is laminated on the upper surface of the conductor layer. The insulating layer may be provided by applying a liquid coating composition, by transfer of a dry film, or by a combination thereof. Transfer of a dry film is advantageous for process simplification. A liquid coating composition can be applied by screen printing, roll coating, curtain coating or like, techniques. A dry film can be transferred by hot lamination under pressure.

A via hole is made through the insulating layer by photo via technology or laser machining in a position corresponding to the conductor layer formed on the substrate. A conductor pattern layer and a via conductor are then provided on the insulating layer and on the inner wall of the via hole, respectively, to make an electrical interconnection between the conductor pattern layer and the conductor layer.

Insulating layers and conductor pattern layers are then built up alternately on the conductor pattern layer while connecting a lower conductor layer and an upper conductor layer through via conductors in the same manner as described above to give an ML-PWB having a plurality of insulating layers and a plurality of conductor pattern layers in an alternate configuration.

EXAMPLES

The present invention will now be illustrated in greater detail with reference to Examples.

Examples 1 and 2 and Comparative Examples 1 and 2

Evaluation of Compatibility:
The following materials were prepared.

a) Thermosetting Resin
   Bisphenol A epoxy resin (Epikote 828, available from Japan Epoxy Resin Co., Ltd.)
   Glycidylamine epoxy resin (Epikote 630, available from Japan Epoxy Resin Co., Ltd.)

b) Curing Agent
   Dicyandiamide curing agent (DICY7, available from Japan Epoxy Resin Co., Ltd.; average particle size: 7 μm; powder form)

c) Curing Catalyst
   Alicyclic dimethylurea (U-CAT3503N, available from San-Apro Ltd.)
   Aromatic dimethylurea (U-CAT3502T, available from San-Apro Ltd.)
   2,4-Diamino-6-[2'-undecylimidazoly-(1)']-ethyl-s-triazine (Curezol 11Z-A, available from Shikoku Corp.) (hereinafter referred to as imidazole type)

d) Solvent
   Dimethylformamide (DMF)
   In a beaker was put 50 g of an epoxy resin, and 1 to 5 g of a curing agent and 0.1 to 4 g of a curing catalyst and optionally 25 g of DMF (solvent) were mixed therein by stirring to prepare a mixture having the composition shown in Table 1 below.

The beaker containing the mixture as prepared was put on a hot plate via an aluminum plate. The mixture was gradually heated at a rate of about 20° C./min while stirring with a spatula. The mixed state of the mixture was observed, and the temperature at which the mixture became homogeneous was taken as a compatibilizing temperature, which is shown in Table 1. The mixture was then left to stand in an atmosphere of 100 to 160° C. for 1 to 5 hours to cure. The temperature at which the mixture cured (curing temperature) is shown in Table 1.

A cut area of the cured product was observed under a microscope at 200 magnification times to inspect for non-uniformity of the structure, i.e., separation between the thermosetting resin and the curing agent and/or remaining of the curing agent. The results of inspection are shown in Table 1. A cured mixture showing a uniform dispersed state with no phase separation nor residue of the curing agent was judged good in compatibility, while one showing non-uniformity due to separation or residue of the curing agent was judged poor in compatibility.

TABLE 1

|  | Thermo-setting Resin | Curing Agent | Curing Catalyst | Solvent | Compatibilizing Temp. | Curing Temp. | Non-uniformity of Cured Product |
|---|---|---|---|---|---|---|---|
| Example 1 | bisphenol A epoxy resin | dicyandiamide | aromatic dimethylurea | none | 140° C. or lower | 160° C. | no |
| Example 2 | bisphenol A/glycidylamine mixed epoxy resin | dicyandiamide | alicyclic dimethylurea | none | 140° C. or lower | 150° C. | no |
| Compara. Example 1 | bisphenol A epoxy resin | dicyandiamide | imidazole type | DMF | room temp. | 160° C. | no |
| Compara. Example 2 | bisphenol A epoxy resin | dicyandiamide | imidazole type | none | incompatible till heated to curing temp. | 160° C. | yes |

As is apparent from the results in Table 1 above, the mixtures of Examples 1 and 2 became homogeneous at 140° C. or lower, indicating excellent compatibility between the resin and the curing agent. The cured products obtained from these mixtures suffered from no separation between the resin and the curing agent.

The composition of Comparative Example 2 is the same as that of Examples 1 and 2, except for using the imidazole curing catalyst in place of the aromatic or alicyclic dimethylurea curing catalyst. As a result, compatibilization did not occur until the mixture was heated to its curing temperature (160° C.), proving the mixture of Comparative Example 2 poor in compatibility. The cured product of Comparative Example 2 suffered from considerable non-uniformity due to separation between the thermosetting resin and the curing agent.

The composition of Comparative Example 1 is the same as that of Examples 1 and 2, except for using the imidazole curing catalyst in place of the aromatic or alicyclic dimethylurea curing catalyst and using DMF as a solvent. The filling material of Comparative Example 1 was compatibilized at room temperature, proving superior incompatibility to Examples 1 and 2. On curing, however, the solvent remained in the cured product. If applied to a filling material for plugging through-holes of a PWB, the material of Comparative Example 1 is considered to cause deterioration in durability against thermal load imposed, which will be demonstrated hereunder.

Examples 3 to 5 and Comparative Examples 3 to 5

1) Preparation of Filling Material:
The following materials were prepared.

a) Thermosetting Resin
Bisphenol A epoxy resin (Epikote 828, available from Japan Epoxy Resin Co., Ltd.)

b) Curing Agent
Dicyandiamide curing agent (DICY7, available from Japan Epoxy Resin Co., Ltd.; average particle size: 7 μm; powder form)

c) Curing Catalyst
Aromatic dimethylurea (U-CAT3502N, available from San-Apro Ltd.)

2,4-Diamino-6-[2'-undecylimidazoly-(1)']-ethyl-s-triazine (Curezol 11Z-A, available from Shikoku Corp.) (hereinafter referred to imidazole type)

d) Solvent
DMF e) Filler
Cu powder (1300YM, available from Mitsui Mining & Smelting Co., Ltd.; average particle size: 3 μm; maximum particle size: 10 μm)

Cu powder (SFR-Cu-10, available from Nippon Atomized Metal Powders Corp.; average particle size: 10 μm; maximum particle size: 44 μm)

$SiO_2$ powder (FB-48, available from Denki Kagaku Kogyo K.K.; average particle size: 16.6 μm; maximum particle size: 128 μm)

$SiO_2$ powder (FB-5LDX, available from Denki Kagaku Kogyo K.K.; average particle size: 5 μm; maximum particle size: 24 μm)

$SiO_2$ powder (RY200, available from Nippon Aerosil Co., Ltd.; average particle size: 12 nm; maximum particle size: smaller than 5 μm)

All these fillers had a spherical shape.

f) Defoaming Agent
DAPRO U99, available from San Nopco Ltd.

The materials were weighed out to give the formulation shown in Table 2, mixed by stirring in a container, and kneaded in a three-roll mill to prepare a filling material. In Table 2, the amounts of the materials are given by part by weight per 100 parts by weight of the total of the thermosetting resin and the curing agent (PHR).

The water content of the resulting filling material was measured by Karl-Fischer titration. The results obtained are shown in Table 2.

2) Preparation of ML-PWB and Evaluation for Through-Hole Filling Capabilities:
An ML-PWB was produced using the filling material prepared in (1) above. FIG. 1 is a cross section showing the layer configuration of the ML-PWB 1 produced. The structure and the process of fabrication of the ML-PWB 1 will be described with reference to FIG. 1.

A bismaleimide triazine substrate having a thickness of 800 μm was drilled to make through-holes having a diameter of 240 μm. The inner wall of the through-holes was plated with copper to form a conductor 3 having a thickness of 20 μm to make plated through-holes 4 having an inner diameter of 200 μm.

A 150 μm-thick printing mask was placed on one side of the substrate 2, and a filling material 5 was applied into the plated through-holes 4 by printing. The substrate was allowed to stand in an atmosphere of 100 to 150° C. to half cure the filling material 5.

The following steps were carried out on each side of the substrate 2 having plated through-holes 4. The surface of the substrate 2 was polished. The polished surface of the filling material was observed under a microscope at 50 magnifications. A substrate having the exposed side of the filling material 5 on both sides of the substrate sticking out of the substrate surface was judged good in printability; for the filling material would not sink after polishing and would not give rise to a problem in subsequent plating. A substrate having one or both exposed sides of the filling material 5 sunken below the substrate surface was judged poor in printability. The results of printability evaluation are shown in Table 2.

The resin smear was removed by a known desmear processing, the polished surface was plated to form a conductor layer 6 having a thickness of 20 μm which covered the exposed surface of the filling material 5. The substrate 2 was then allowed to stand in an atmosphere of 150 to 170° C. to completely cure the filling material 5. The conductor layer 6 was processed by exposure, development, etching, and resist stripping to form a desired conductor pattern.

A dry resin film was hot pressed onto the conductor layer 6 to form an insulating layer 7. Via holes 8 were drilled through the insulating layer 7 with a CO₂ laser in positions corresponding to the underlying conductor layer 6. A conductor pattern layer 9 was formed on the insulating layer 7, and via conductors 10 were formed on the inner wall of the via holes 8 so as to connect the conductor pattern layer 9 and the conductor layer 6 which covered the filling material 5.

An insulating layer 11 and a conductor pattern layer 12 were alternately formed on the conductor pattern layer 9 in the same manner as described above. A solder resist layer 13 was formed on the uppermost conductor pattern layer. The outermost conductor pattern layer 12 was Ni-plated, and the Ni-plate was Au-plated to complete an ML-PWB 1.

The ML-PWB 1 was subjected to a thermal shock test, in which the ML-PWB was exposed to 2000 cycles of thermal shock alternating between −55° C. and +130° C. After the test, a cut area of the through-holes 4 was inspected under a microscope at 200 magnifications for delaminations between the filling material 5 and the conductor layers 6 and the wall conductors 3 and cracks in these parts. The cut area was also inspected for delaminations and cracks of the insulating layers 7 and 11, the conductor pattern layers 9 and 12, the solder resist layers 13. The number of ML-PWBs suffering from any of the delaminations and cracks (number of rejects) was counted. The results obtained are shown in Table 2.

TABLE 2

| | | | | | Composition of Filling Material | | | | | | |
|---|---|---|---|---|---|---|---|---|---|---|---|
| | | | | | | Filler | | | Amount | | | |
| | Epoxy Resin (PHR) | Dicyan-diamide (PHR) | Curing Catalyst and Amount (PHR) | Solvent and Amount (PHR) | Kind | Avg. Particle Size (μm) | Max. Particle Size (μm) | Amount (PHR) | of Defoaming Agent (PHR) | Water Content (wt %) | Print-ability | Number of Rejects |
| Ex. 3 | 89 | 11 | aromatic dimethyl-urea (3) | none | Cu SiO₂ | 3 12 nm | 10 <5 | 500 2 | 0.1 | 0.03 | good | 0/20 |
| Ex. 4 | 96 | 4 | aromatic dimethyl-urea (3) | none | SiO₂ | 5 | 24 | 100 | 0.1 | 0.10 | good | 0/20 |
| Ex. 5 | 93 | 7 | aromatic dimethyl-urea (3) | none | Cu SiO₂ | 10 12 nm | 44 <5 | 500 2 | 0.1 | 0.03 | good | 0/20 |
| Comp. Ex. 3 | 96 | 4 | imidazole (1) | DMF (55) | SiO₂ | 5 | 24 | 100 | 0.1 | 0.50 | poor | 4/20 |
| Comp. Ex. 4 | 96 | 4 | aromatic dimethyl-urea (3) | none | SiO₂ SiO₂ | 16.6 12 nm | 128 <5 | 100 2 | 0.1 | 0.05 | poor | not tested |
| Comp. Ex. 5 | 96 | 4 | aromatic dimethyl-urea (3) | none | SiO₂ | 12 nm | <5 | 15 | 0.1 | 0.08 | poor | not tested |

As is apparent from the results in Table 2, the filling material of Examples 3 to 5 exhibited excellent printability to provide plugged through-holes, on which the conductor layer 6 was satisfactorily formed by plating. When subjected to a thermal shock test, the ML-PWBs of Examples underwent neither delamination between the filling material 5 and the conductor layers 6 and the wall conductors 3 nor cracking in these parts. No delaminations nor cracks developed in the insulating layers 7 and 11, the conductor pattern layers 9 and 12, the solder resist layers 13, etc., either.

The composition of the filling material used in Comparative Example 3 is the same as that of Example 4, except for using the imidazole curing catalyst in place of the aromatic dimethylurea curing catalyst and using DMF as a solvent. It is understood that this composition is unfavorable seeing that the ML-PWB suffered from delaminations or cracks in a thermal shock test.

The filling material used in Comparative Example 4 is made up of the same materials as those used in Example 3, except for using a filler comprising particles having an average particle size of 16.6 μm and a maximum particle size of 128 μm which are far larger than those of the filler used in Example 3. On account of this, the filling material of Comparative Example 4 had poor capability of filling the through-holes. As a result, the filling material in the though-holes had a dip on the opposite side of the substrate 2 and therefore had poor platability in plating to form the conductor layer 6. Since plating and lamination of the insulating layer 7 failed, the resulting ML-PWB was not subjected to the thermal shock test.

2) Evaluation of Peel Strength

The sample thus prepared was subjected to a pressure cooker test (PCT), in which the sample was maintained in a pressure cooker at 121° C. and 2.1 atm for 168 hours. The peel strength between the filling material layer and the conductor layer was measured before and after the PCT. In a peel test, one end of the 10 mm wide conductor layer was slightly peeled off the filling material layer. This free end was clamped and peeled at a peel angle of 90° at a pulling rate of 50±1 mm/min to measure the peel strength. The results obtained are shown in Table 3.

TABLE 3

| | Composition of Filling Material | | | | | | | Peel Strength | |
|---|---|---|---|---|---|---|---|---|---|
| | | | | Filler | | | | (kN/m) | |
| | Epoxy | Curing | Curing | | Average | Maximum | | Defoaming | | |
| | Resin (PHR) | Agent (PHR) | Catalyst (PHR) | Kind | Particle Size (μm) | Particle Size (μm) | Amout (PHR) | Agent (PHR) | Before PCT | After PCT |
| Example 5 | 96 | dicyandiamide (4) | aromatic dimethylurea (3 PHR) | SiO$_2$ | 5 | 24 | 100 | 0.1 | 0.61 | 0.54 |
| Comp. Example 6 | 95 | imidazole (5) | none | | | | | | 0.60 | 0.39 |

The composition of the filling material used in Comparative Example 5 is the same as that of Example 4, except for using a filler having an average particle size of 12 nm and a maximum particle size of less than 5 μm which are far smaller than those of the filler used in Example 4. On account of this, the filling material of Comparative Example 5 had an increased viscosity and poor workability in plugging the through-holes by printing, resulting in fill starvation. As a result, the filling material in the though-holes had a dip on the opposite side of the substrate 2, which indicated poor printability of the filling material. Since plating and lamination of the insulating layer 7 failed, the resulting ML-PWB was not subjected to the thermal shock test.

Example 5 and Comparative Example 6

1) Preparation of Samples:

A filling material was prepared in the same manner as in Example 4. For comparison, a filling material was prepared in the same manner as in Example 4, except for using 95 PHR of the epoxy resin, replacing the aromatic dimethylurea curing agent with 5 HPR of the same imidazole type curing agent as used in the foregoing Comparative Examples, and using no curing catalyst as shown in Table 3.

Each of the resulting filling materials was applied to a bismaleimide triazine substrate having a thickness of 800 μm to a thickness of 100 μm by screen printing. The coated substrate was allowed to stand in an atmosphere of 100 to 150° C. to half cure the filling material.

The surface of the substrate was polished, desmeared in a known manner, and plated with copper in a known manner to form a conductor layer in a stripe with 10 mm width. The substrate was then allowed to stand in an atmosphere of 150 to 170° C. to completely cure the filling material.

Table 3 shows that the peel strength of Comparative Example 6 was 0.60 kN/m before PCT and 0.39 kN/m after PCT, indicating about 35% reduction due to PCT. On the other hand, the peel strength in Example 4 was 0.61 kN/m before PCT and 0.54 kN/m after PCT. That is, the reduction in peel strength due to PCT was controlled to about 14%, demonstrating a marked improving effect.

Examples 6 to 13

Evaluation of Through-Hole Filling Capabilities (with Variations in Composition and Filler's Particle Size):

Filling materials were prepared in accordance with the formulations shown in Table 4, the materials of which were the same as those used in Example 3, except the particle size of the filler, (i.e., Cu and SiO$_2$). All the fillers used were powders having an early spherical shape. The unit PHR in Table 4 means "per 100 parts by weight of the total of the thermosetting resin and the curing agent". While not shown, all the filling materials contained 0.1 PHR of the same defoaming agent as used in Example 3.

In order to evaluate the through-hole filling capabilities of the resulting filling materials, an ML-PWB was made using each of the filling material of Example 3 and the filling materials prepared above in the same manner as in Example 3. In Examples 3, 6 to 9 and 11 to 13, the through-holes had a diameter of 240 μm, and the Cu-plated through-holes had a diameter of 200 μm. In Example 10, an additional ML-PWB was prepared by using a 400 μm thick bismaleimide triazine substrate, drilling through-holes having a diameter of 100 μm, plating the inner wall of the through-holes with copper to a deposit thickness of 25 μm to form plated through-holes having a diameter of 50 μm, and this ML-PWB was also evaluated in the same manner. The results obtained are shown in Table 4.

TABLE 4

| Example No. | Composition of Filling Material | | | | | | Printability | | Number of Rejects | |
|---|---|---|---|---|---|---|---|---|---|---|
| | Epoxy Resin*1 (PHR) | Curing Agent*2 (PHR) | Curing Catalyst*3 (PHR) | Filler | | | Plated Through-Hole Diameter | | Plated Through-Hole Diameter | |
| | | | | Kind | Average Particle Size (μm) | Maximum Particle Size (μm) | Amount (PHR) | 200 μm | 50 μm | 200 μm | 50 μm |
| 3 | 89 | 11 | 3 | Cu | 3 | 10 | 500 | good | — | 0/20 | — |
|  |  |  |  | SiO$_2$ | 12 nm | <5 | 2 |  |  |  |  |
| 6 | 96 | 4 | 0.5 | Cu | 10 | 44 | 500 | good | — | 0/20 | — |
|  |  |  |  | SiO$_2$ | 12 nm | <5 | 2 |  |  |  |  |
| 7 | 96 | 4 | 9 | Cu | 10 | 44 | 500 | good | — | 0/20 | — |
|  |  |  |  | SiO$_2$ | 12 nm | <5 | 2 |  |  |  |  |
| 8 | 95 | 5 | 3 | Cu | 10 | 44 | 500 | good | — | 0/20 | — |
|  |  |  |  | SiO$_2$ | 12 nm | <5 | 2 |  |  |  |  |
| 9 | 97 | 3 | 3 | Cu | 10 | 44 | 500 | good | — | 0/20 | — |
|  |  |  |  | SiO$_2$ | 12 nm | <5 | 2 |  |  |  |  |
| 10 | 96 | 4 | 3 | Cu | 1.5 | 10 | 150 | good | good | 0/20 | 0/20 |
|  |  |  |  | SiO$_2$ | 12 nm | <5 | 2 |  |  |  |  |
| 11 | 96 | 4 | 3 | Cu | 10 | 44 | 750 | good | — | 0/20 | — |
|  |  |  |  | SiO$_2$ | 2.5 | 10 | 250 |  |  |  |  |
| 12 | 96 | 4 | 3 | SiO$_2$ | 0.1 | 5 | 100 | good | — | 0/20 | — |
| 13 | 96 | 4 | 3 | SiO$_2$ | 12 | 75 | 100 | good | — | 0/20 | — |

*1Bisphenol A epoxy resin (Epikote 828)
*2Dicyandiamide curing agent (DICY7);
*3Aromatic dimethylurea (U-CAT3502)

In Examples 3 and 6 to 13 the filling material 5 exhibited excellent printability for enabling the subsequent formation of the conductor layer 6. The thermal shock test caused neither delaminations between the filling material 5 and the conductor layers 6 or the wall conductors 3 nor cracks in these parts. Delaminations or cracks did not occur, either, in the insulating layers 7 and 11, the conductor pattern layers 9 and 12, the solder resist layers 13, etc. These results verify that excellent printability of a filling material is assured and that ML-PWBs free from such defects as delaminations and cracks can be obtained by using a filling formulation comprising 89 to 97 PHR of a thermosetting resin, 3 to 11 PHR of a curing agent, 0.5 to 9 PHR of a curing catalyst, and 100 to 1000 PHR of a filler based on the total weight of the thermosetting resin and the curing agent. It was also proved that excellent printability of the filling material is assured and that ML-PWBs free from delaminations and cracks can be obtained by using fillers having an average particle size of 0.1 to 12 μm and a maximum particle size of 5 to 75 μm.

The filling material of the present invention, the ML-PWB produced by using the filling material, and the process of producing the ML-PWB by using the filling material produce the following effects.

The filling materials 5 used in Examples comprise a compatible mixture of a thermosetting resin and a curing agent and a filler uniformly dispersed in the mixture. Therefore, when they are pressed by printing into plated through-holes 4 of the PWB substrate 2, they exhibit improved printability and good adhesion to the conductor layer 6 provided thereon. An ML-PWB produced by using the filling material 5 is prevented from delaminations between the filling material 5 and the conductor layers 6 provided thereon or the wall conductors 3 and from cracking in these parts in a thermal cycle test. In addition, delaminations and cracks of the insulating layers 7 and 11, the conductor pattern layers 9 and 12, the solder resist layers 13, and the like are also prevented. Thus, the ML-PWB has satisfactory reliability.

Where in using an almost spherical filler having an average particle size of 0.1 to 12 μm and a maximum particle size of 75 μm or less, the filling material is capable of plugging the entire space of plated through-holes 4 even with a diameter of 200 μm or smaller and does not sink below the level of the substrate on and after curing. Thus, the filling material has satisfactory printability, which assures good adhesion to the conductor layer 6 subsequently formed thereon by plating.

While, in Examples, the conductor layers 6 and the conductor pattern layers 9 and 12 were formed by plating with copper, other metals can be used as a plating material as long as the plating material has low resistance and is capable of lamination with good precision.

While, in Examples, the upper conductor pattern layer 12 of the ML-PWB 1 was Ni-plated and then Au-plated, these plating materials may be replaced with other low-resistant metals, or the conductor pattern layer 12 does not always need to be plated.

This application is based on Japanese Patent application JP 2003-125477, filed Apr. 30, 2003, the entire contents of which is hereby incorporated by reference, the same as if set forth at length.

What is claimed is:

1. A multilayer printed wiring board comprising:
   a substrate;
   a plated through-hole formed in the substrate;
   a solvent-free insulative filling material filled in the plated through-hole;
   a conductor layer plated on an exposed surface of the solvent-free insulative filling material;
   an insulating layer formed on a surface of the conductor layer;
   a conductive pattern layer formed on a surface of the insulating layer; and
   a via conductor connecting the conductor layer and the conducting pattern layer;

wherein the solvent-free insulative filling material includes a filler, a thermosetting epoxy resin, a curing catalyst and a dicyandiamide curing agent, wherein the filling material has cured with a uniform composition without localizing at least the filler, the thermosetting epoxy resin and the dicyandiamide curing agent, wherein the plated through-hole has a diameter between 50 μm and 200 μm, wherein the dicyandiamide curing agent is used to reduce deterioration in adhesive strength between the solvent-free insulative filling material and the conductor layer, wherein the curing catalyst comprises a urea compound; and wherein the filler is substantially spherical particles having an average particle size of 0.1 to 12 μm and a maximum particle size of 75 μm or smaller.

2. The multilayer printed wiring board according to claim 1, wherein the conductor layer, the insulating layer and conductor pattern layer are provided in this order.

3. The multilayer printed wiring board according to claim 1, wherein the urea compound is a material selected from the group consisting of dimethylurea compound, aromatic urea compound, alicyclic urea compound and halogenated urea compound.

4. The multilayer printed wiring board according to claim 1, wherein the urea compound is a material selected from the group consisting of dimethylurea compound, aromatic urea compound and alicyclic urea compound.

5. The multilayer printed wiring board according to claim 1, wherein the dicyandiamide curing agent has at least one form selected from the group consisting of powders, dendrites, and flakes.

6. The multilayer printed wiring board according to claim 5, wherein the dicyandiamide curing agent is a powder having an average particle size of 0.1 to 100 μm.

7. The multilayer printed wiring board according to claim 5, wherein the dicyandiamide curing agent is a powder having an average particle size of 1 to 30 μm.

8. The multilayer printed wiring board according to claim 5, wherein the dicyandiamide curing agent is a powder having an average particle size of 1 to 15 μm.

* * * * *